US012772371B2

(12) United States Patent
Chen et al.

(10) Patent No.: US 12,772,371 B2
(45) Date of Patent: Oct. 20, 2026

(54) HEAT DISSIPATION MODULE

(71) Applicant: ASUSTek COMPUTER INC., Taipei City (TW)

(72) Inventors: Po-Ting Chen, Taipei City (TW); Chang-Hung Chen, Taipei City (TW); Chih-Hung Chuang, Taipei City (TW)

(73) Assignee: ASUSTek COMPUTER INC., Taipei City (TW)

( * ) Notice: Subject to any disclaimer, the term of this patent is extended or adjusted under 35 U.S.C. 154(b) by 259 days.

(21) Appl. No.: 18/777,594

(22) Filed: Jul. 19, 2024

(65) Prior Publication Data

US 2025/0380352 A1 Dec. 11, 2025

(30) Foreign Application Priority Data

Jun. 6, 2024 (TW) ................................ 113121006

(51) Int. Cl.
*H05K 1/00* (2006.01)
*H05K 1/02* (2006.01)

(52) U.S. Cl.
CPC ... *H05K 1/021* (2013.01); *H05K 2201/10462* (2013.01); *H05K 2201/2027* (2013.01)

(58) Field of Classification Search
CPC ......... H05K 1/021; H05K 2201/10462; H05K 2201/2027
USPC .......................................................... 361/707
See application file for complete search history.

(56) References Cited

U.S. PATENT DOCUMENTS

| | | | | |
|---|---|---|---|---|
| 7,017,653 | B2 * | 3/2006 | Lotter | H10W 40/641 165/185 |
| 7,580,262 | B2 * | 8/2009 | Chou | G06F 1/20 174/16.3 |
| 8,517,332 | B2 * | 8/2013 | Liu | B25B 5/14 248/500 |
| 2008/0239677 | A1 * | 10/2008 | Coleman | H10W 40/641 361/719 |
| 2023/0307317 | A1 | 9/2023 | Chang et al. | |
| 2024/0381532 | A1 | 11/2024 | Chen | |

FOREIGN PATENT DOCUMENTS

| | | | |
|---|---|---|---|
| CN | 113138644 A * | 7/2021 | G06F 1/20 |
| CN | 116206638 | 6/2023 | |
| CN | 219418493 | 7/2023 | |
| TW | M651578 | 2/2024 | |
| TW | I844361 | 6/2024 | |

* cited by examiner

*Primary Examiner* — Zhengfu J Feng
(74) *Attorney, Agent, or Firm* — JCIPRNET

(57) ABSTRACT

A heat dissipation module is adapted to be installed on a motherboard having a connector. The connector is adapted to connect an interface card. The heat dissipation module includes a base assembly adapted to be fixed on the motherboard, a heat dissipation member, and a fastening member. The base assembly is an integrated base body having opposite first and second ends. The first end is adjacent to the connector and has a fixing portion. The second end has a fastening portion. The interface card is adapted to be installed between the first end and the second end. The heat dissipation member has opposite third and fourth ends. The third end is adapted to be detachably connected to the fixing portion. The fastening member is pivoted on the fourth end and adapted to be detachably connected to the fastening portion.

11 Claims, 23 Drawing Sheets

HEAT DISSIPATION MODULE

CROSS-REFERENCE TO RELATED APPLICATION

This application claims the priority benefit of Taiwan application serial no. 113121006, filed on Jun. 6, 2024. The entirety of the above-mentioned patent application is hereby incorporated by reference herein and made a part of this specification.

BACKGROUND

Technical Field

The disclosure relates to a heat dissipation module, and particularly relates to a heat dissipation module used for interface card heat dissipation.

Description of Related Art

Generally speaking, the installation process of the interface card is to insert the interface card into the connector located on the motherboard and then fix it with screws. However, with screw fixation, users need to use hand tools to lock and install the screws, which is more inconvenient to use.

SUMMARY

The disclosure provides a heat dissipation module adapted to be installed on a motherboard. The motherboard has a connector. The connector is adapted to connect an interface card. The heat dissipation module includes a base assembly, a heat dissipation member, and a fastening member. The base assembly is adapted to be fixed on the motherboard. The base assembly is an integrated base body. The integrated base body has a first end and a second end opposite to each other. The first end is adjacent to the connector and has a fixing portion. The second end has a fastening portion. The interface card is adapted to be installed between the first end and the second end. The heat dissipation member has a third end and a fourth end opposite to each other. The third end is adapted to be detachably connected to the fixing portion. The fastening member is pivoted on the fourth end and adapted to be detachably connected to the fastening portion. When the third end is connected to the fixing portion, and the interface card is connected to the connector, the fastening member is connected to the fastening portion, so that the heat dissipation member is fixed to the base assembly.

The disclosure provides a heat dissipation module adapted to be installed on a motherboard. The motherboard has a connector. The connector is adapted to connect an interface card. The heat dissipation module includes a base assembly, a heat dissipation member, and a fastening member. The base assembly is adapted to be fixed on the motherboard. The base assembly includes a first base body and a second base body. The first base body is adjacent to the connector, and the first base body has a fixing portion. The second base body is away from the connector, and the second base body has a fastening portion. The interface card is adapted to be installed between the first base body and the second base body. The heat dissipation member has a first side and a second side opposite to each other. The first side is adapted to be detachably connected to the fixing portion. The fastening member is pivoted on the second side and adapted to be detachably connected to the fastening portion. When the first side is connected to the fixing portion, and the interface card is connected to the connector, the fastening member is connected to the fastening portion, so that the heat dissipation member is fixed to the base assembly.

Based on the above, in the heat dissipation module of the disclosure, the interface card is adapted to be installed between the first end and the second end. The third end is adapted to be detachably connected to the fixing portion. The fastening member is pivoted on the fourth end and adapted to be detachably connected to the fastening portion. When the third end is connected to the fixing portion, and the interface card is connected to the connector, the fastening member is connected to the fastening portion, so that the heat dissipation member is fixed to the base assembly. Through the quick release structure, the interface card and the heat dissipation member can be quickly installed and disassembled by the user with both hands without using hand tools, which has excellent ease of use.

DESCRIPTION OF THE EMBODIMENTS

Figure 1:
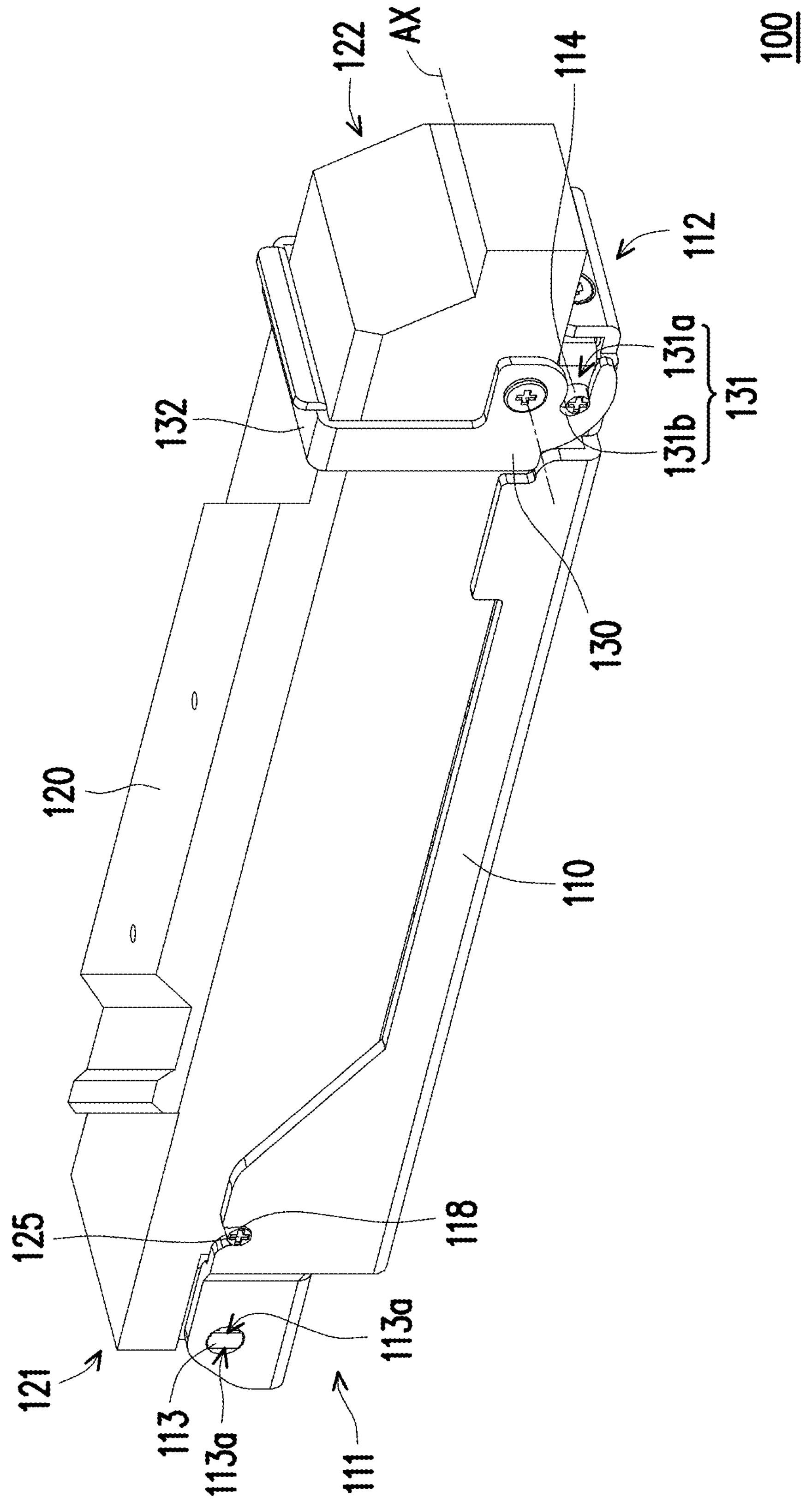
FIG. 1 and FIG. 2 are schematic views of a heat dissipation module according to a first embodiment of the disclosure from different viewing angles.
Figure 2:
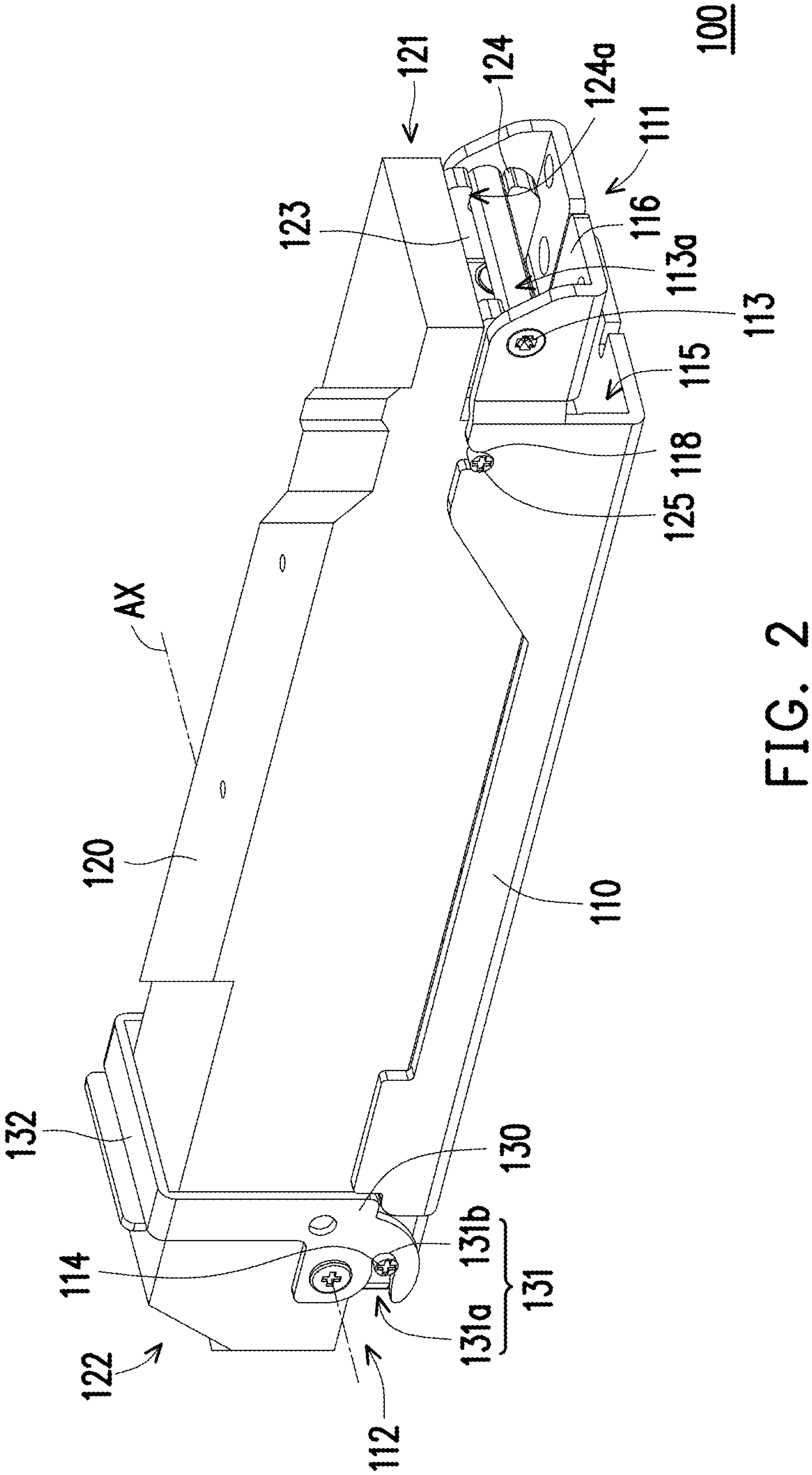
Figure 3:
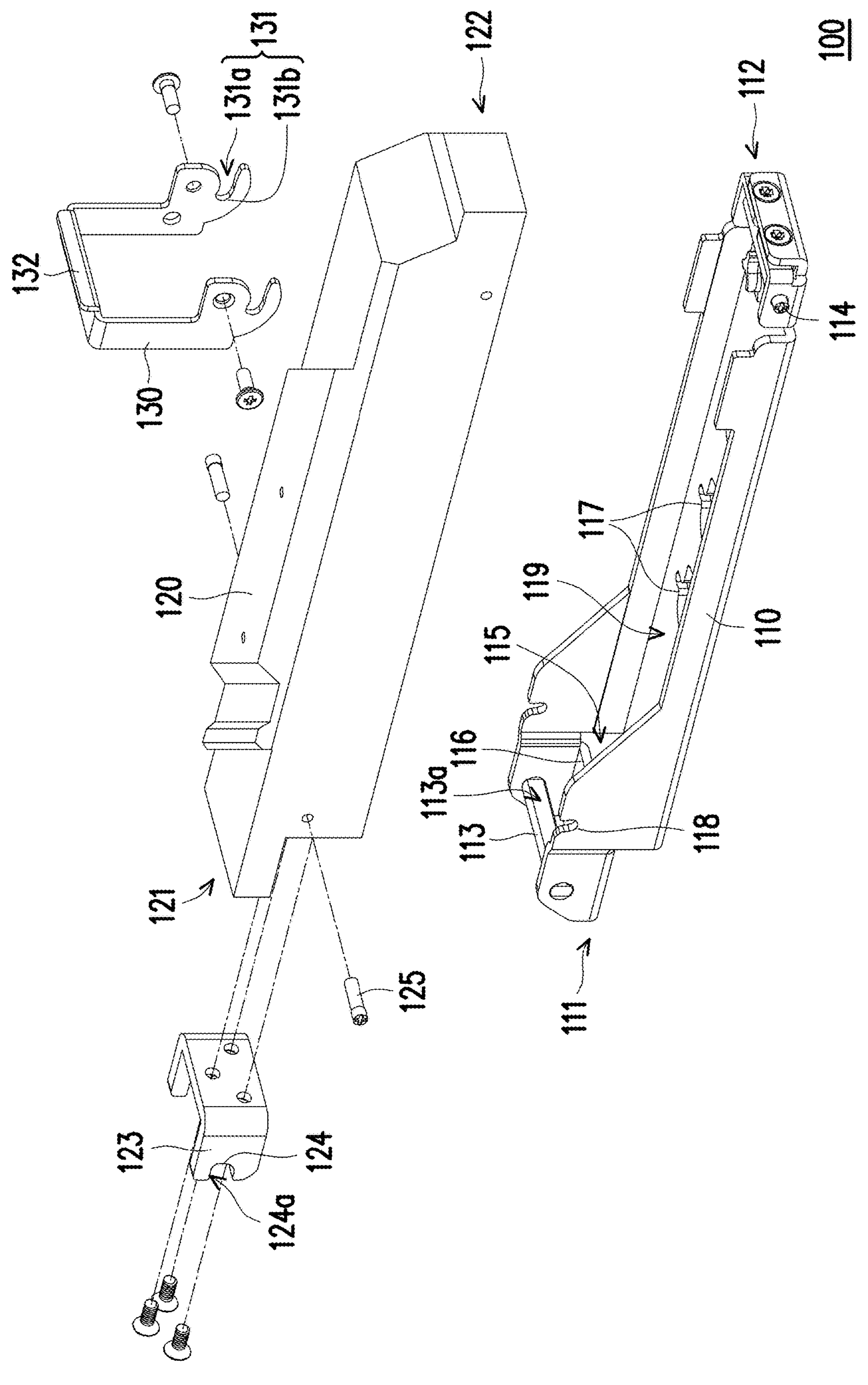
FIG. 3 and FIG. 4 are schematic exploded views of the heat dissipation module of FIG. 1 from different viewing angles.
Figure 4:
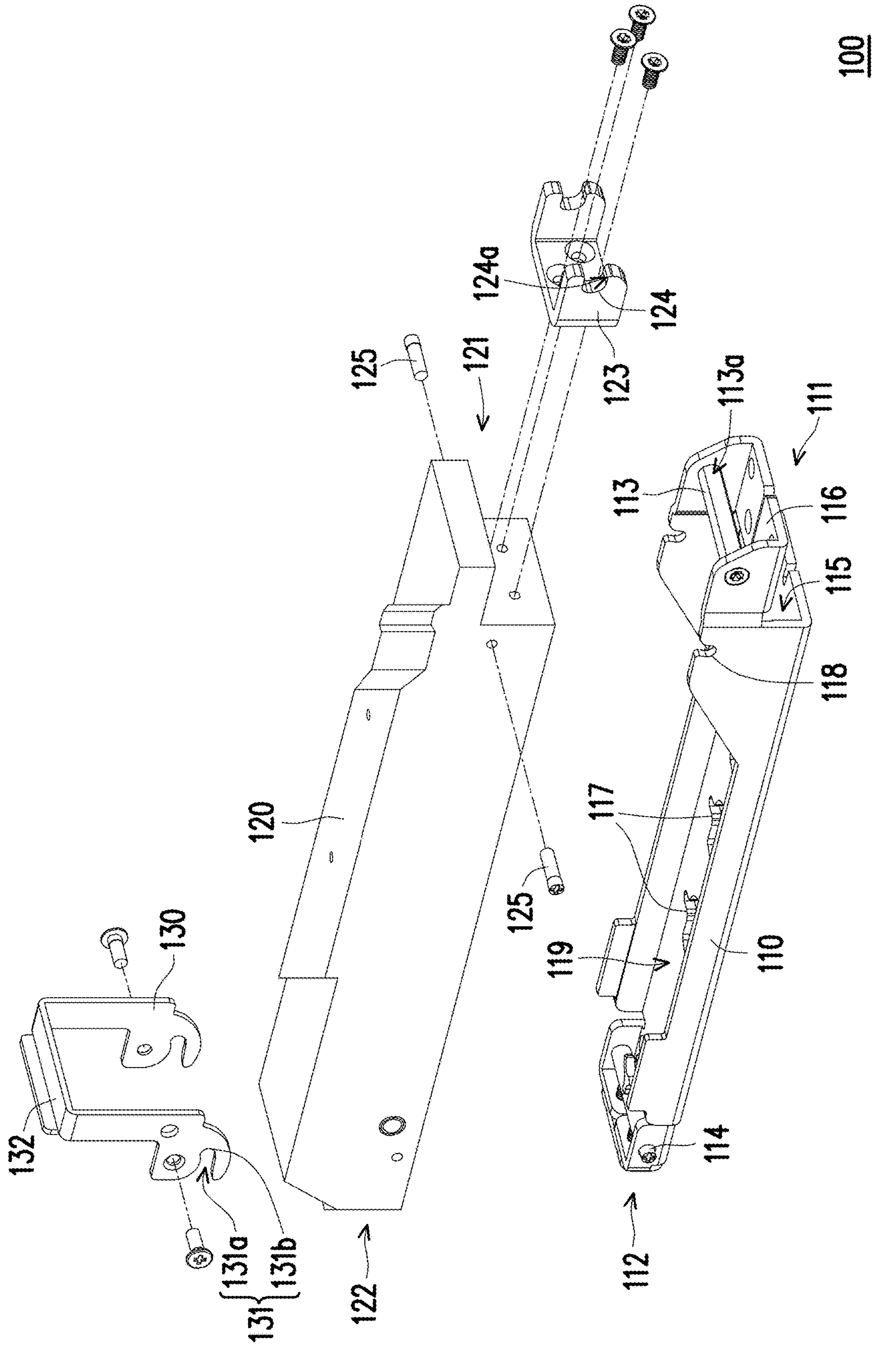

Referring to FIG. 1, FIG. 2, FIG. 3, FIG. 4, and FIG. 5, a heat dissipation module 100 of the disclosure is adapted to be installed on a motherboard 50. The motherboard 50 can be further installed on a case of a computer host. However, the disclosure is not limited thereto.

Referring to FIG. 1, FIG. 2, FIG. 3, FIG. 4, and FIG. 7, the motherboard 50 has a connector 51. The connector 51 is adapted to connect an interface card 52. The interface card 52 is, for example, an SSD interface card with M.2 specifications, but the disclosure is not limited thereto.

Referring to FIG. 1, FIG. 2, FIG. 3, FIG. 4, and FIG. 13, the heat dissipation module 100 includes a base assembly 110, a heat dissipation member 120, and a fastening member 130. The heat dissipation member 120 is, for example, a heat sink, but the disclosure is not limited thereto.

Referring to FIG. 1, FIG. 3, FIG. 7, and FIG. 10, the base assembly 110 is adapted to be fixed on the motherboard 50. The base assembly 110 is an integrated base body. The integrated base body has a first end 111 and a second end 112 opposite to each other. The first end 111 is adjacent to the connector 51 and has a fixing portion 113. The second end 112 has a fastening portion 114. The interface card 52 is adapted to be installed between the first end 111 and the second end 112.

The heat dissipation member 120 has a third end 121 and a fourth end 122 opposite to each other. The third end 121 is adapted to be detachably connected to the fixing portion 113. The fastening member 130 is pivoted on the fourth end 122 and adapted to be detachably connected to the fastening portion 114. When the third end 121 is connected to the fixing portion 113, and the interface card 52 is connected to the connector 51, the fastening member 130 is connected to the fastening portion 114, so that the heat dissipation member 120 is fixed to the base assembly 110. The heat dissipation module 100 of the disclosure uses a quick release structure, so that the interface card 52 and the heat dissipation member 120 can be quickly installed and disassembled by the user with both hands without using hand tools, which has excellent ease of use.

In an embodiment, referring to FIG. 2, FIG. 4, FIG. 5, FIG. 6, and FIG. 7, the first end 111 has an installation port 115. The installation port 115 is positioned to be aligned with the connector 51, or towards the connector 51. The interface card 52 is adapted to pass through the installation port 115 and be connected to the connector 51.

In an embodiment, referring to FIG. 2, FIG. 4, FIG. 5, and FIG. 6, the base assembly 110 has a leaning portion 116. The connector 51 is located between the motherboard 50 and the leaning portion 116. In other words, the motherboard 50 and the leaning portion 116 jointly clamp the connector 51 therein to fix the relative position of the connector 51.

In an embodiment, referring to FIG. 5, FIG. 6, FIG. 7, FIG. 8, and FIG. 9, the motherboard 50 has a rotatable fixing member 53. The base assembly 110 has a plurality of through grooves 117 penetrating through two sides. The fixing member 53 passes through one of these through grooves 117. The base assembly 110 is located between the motherboard 50 and the fixing member 53. The interface card 52 is located between the connector 51 and the fixing member 53. In other words, the motherboard 50 and the fixing member 53 jointly clamp the interface card 52 therein to limit the interface card 52, and the connector 51 and the fixing member 53 jointly clamp the interface card 52 therein to limit the interface card 52.

In an embodiment, referring to FIG. 2, FIG. 3, FIG. 4, FIG. 6, and FIG. 10, the fixing portion 113 is an installation shaft. The third end 121 has a connecting portion 123. The connecting portion 123 has a first opening 124. The first opening 124 is inserted on the installation shaft. The installation shaft has two first planes 113*a* on two opposite sides perpendicular to an upper surface 119 of the base assembly 110. The first opening 124 has two second planes 124*a* corresponding to the two first planes 113*a*.

In an embodiment, referring to FIG. 1, FIG. 3, FIG. 11, FIG. 12, and FIG. 13, the fastening portion 114 is a fixture block, and the fastening member 130 has a groove 131. The fastening member 130 is adapted to rotate such that the fixture block moves into the groove 131. Through the cooperation of the fixture block and the groove 131, the relative position of the heat dissipation member 120 is fixed.

In an embodiment, referring to FIG. 1, FIG. 3, FIG. 14, and FIG. 15, the fastening member 130 has a second opening 131*a* and a terminal end 131*b*. The second opening 131*a* and the terminal end 131*b* are connected to two opposite ends of the groove 131. A first distance D1 between the terminal end 131*b* and a rotation axis AX of the fastening member 130 is less than a first distance D1 between the second opening 131*a* and the rotation axis AX.

In an embodiment, referring to FIG. 1, FIG. 3, FIG. 13, and FIG. 15, the fastening member 130 has an operating portion 132. The operating portion 132 can be used by the user to apply force to rotate the fastening member 130, and the heat dissipation member 120 is located between the base assembly 110 and the operating portion 132. In other words, the base assembly 110 and the operating portion 132 jointly clamp the heat dissipation member 120 therein to fix the relative position of the heat dissipation member 120.

In an embodiment, referring to FIG. 2, FIG. 4, FIG. 11, and FIG. 12, the base assembly 110 has two positioning grooves 118. The heat dissipation member 120 has two positioning portions 125. The two positioning portions 125 are installed in the two positioning grooves 118.

The structure of the heat dissipation module 100 of the disclosure has been described above. The process of installing the heat dissipation module 100 of the disclosure to the motherboard 50 will be described below.

Figure 5:
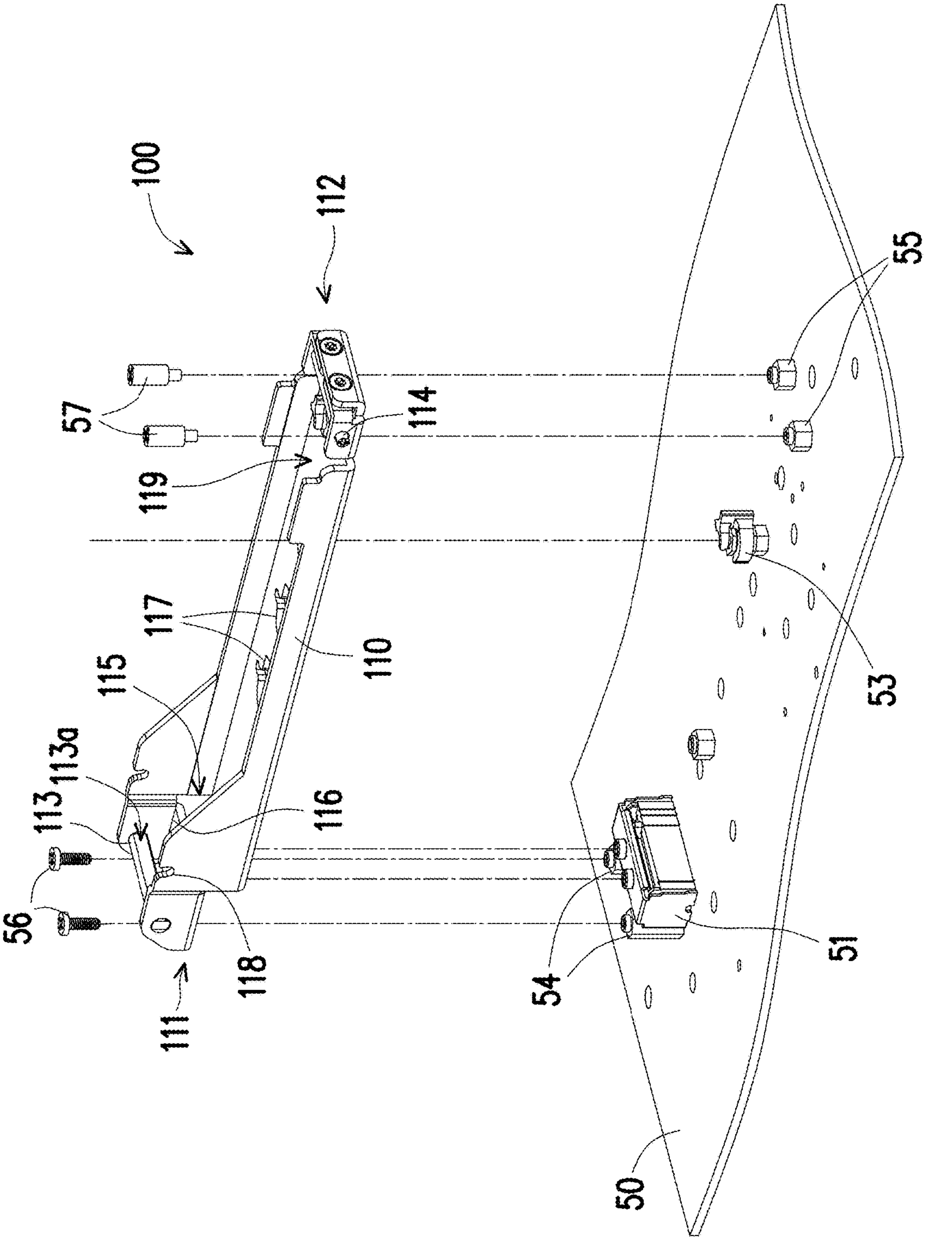
FIG. 5 to FIG. 13 are schematic views of a process of installing the heat dissipation module of FIG. 1 to a motherboard.
Figure 6:
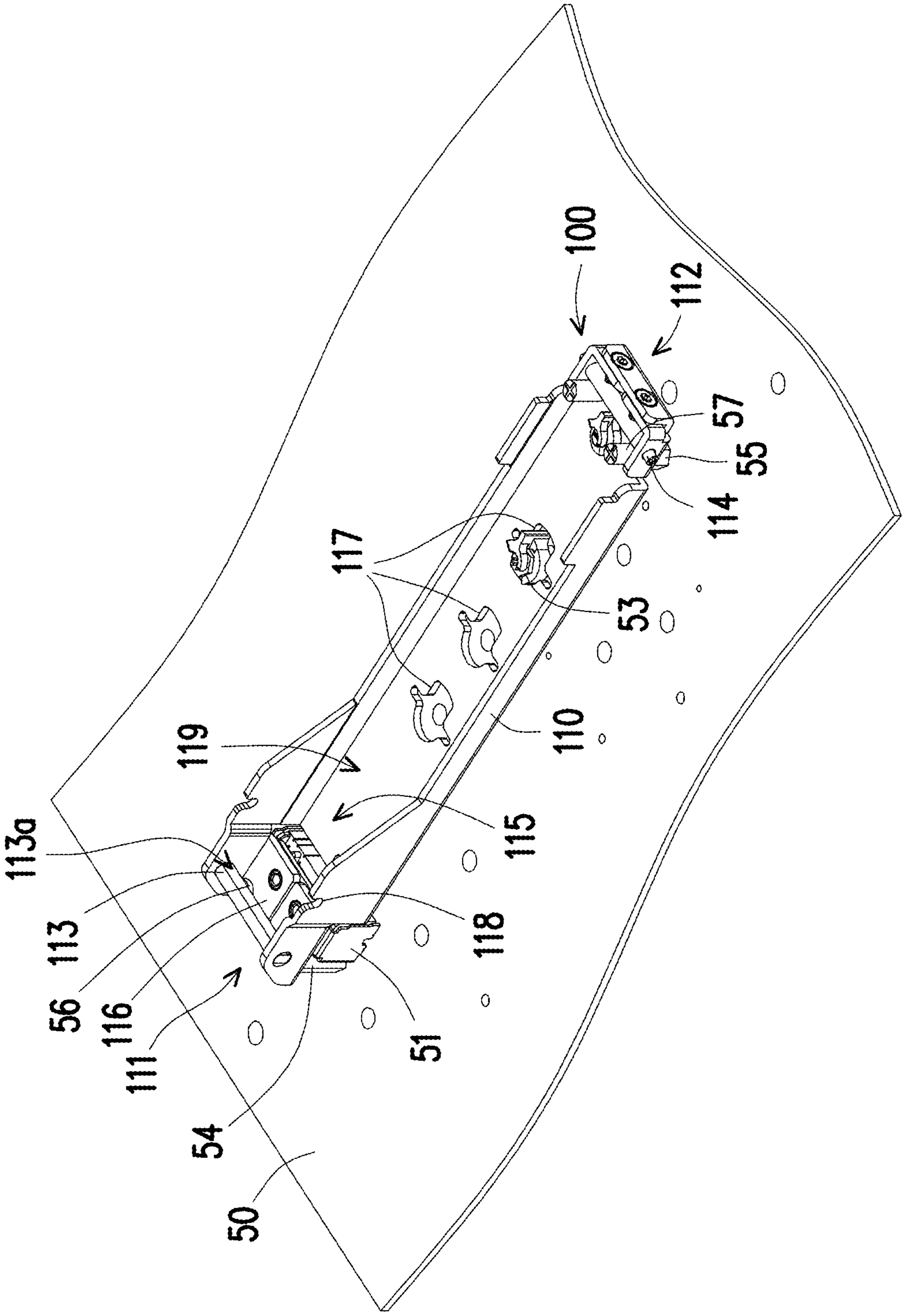

Referring to FIG. 5 and FIG. 6, the motherboard 50 can be pre-configured with the connector 51, the fixing member 53, two first fixing bases 54, and two second fixing bases 55. The number of the first fixing base 54 and the second fixing base 55 here is only for convenience of illustration, and the number of the first fixing base 54 and the second fixing base 55 is not limited thereto.

First, the fixing member 53 is installed on the motherboard 50. After ensuring that the fixing member 53 is placed at an angle that can pass through the through groove 117 normally, two first fasteners 56 are used to pass through the base assembly 110 and lock to the first fixing base 54, so that the connector 51 is located between the leaning portion 116 and the motherboard 50, and two second fasteners 57 are used to pass through the base assembly 110 and lock to the second fixing base 55, so as to install and fix the base assembly 110 on the motherboard 50. The base assembly 110 may be installed with other components such as the fixing portion 113 and the fastening portion 114 in advance or later.

Figure 7:
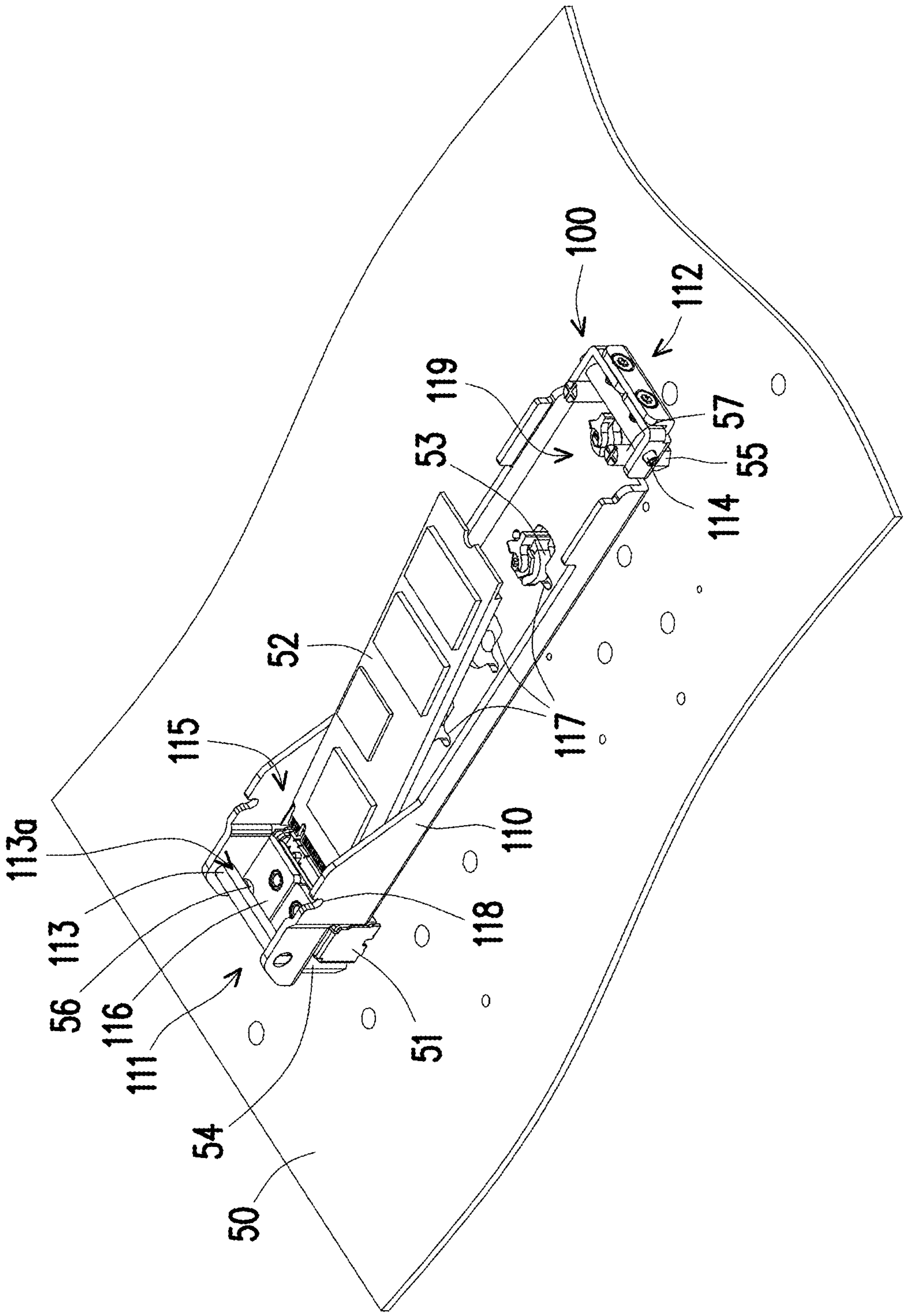

Referring to FIG. 6 and FIG. 7, after the base assembly 110 is installed on the motherboard 50, the interface card 52 passes through the installation port 115 and is inserted into the connector 51 near the first end 111.

Figure 8:
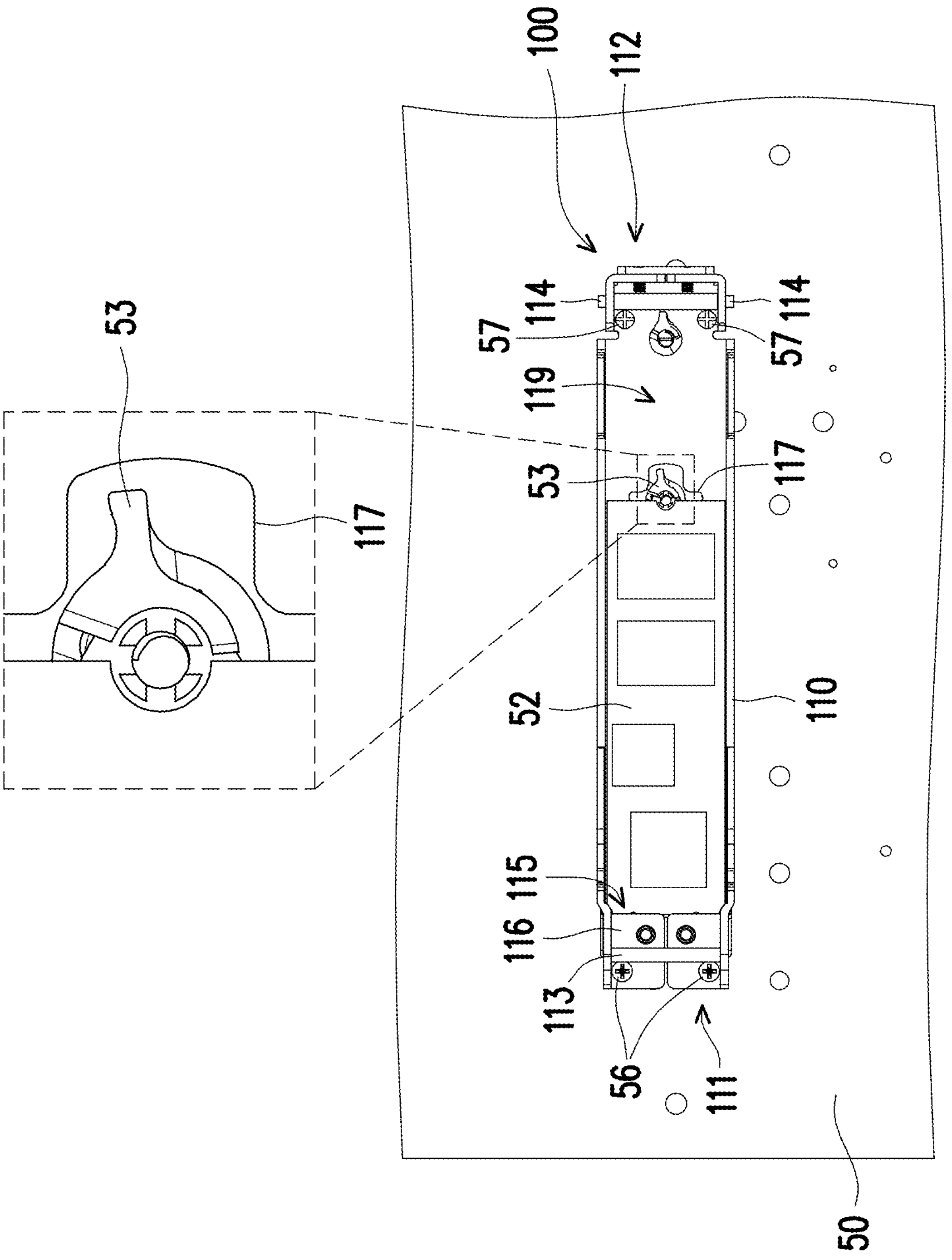
Figure 9:
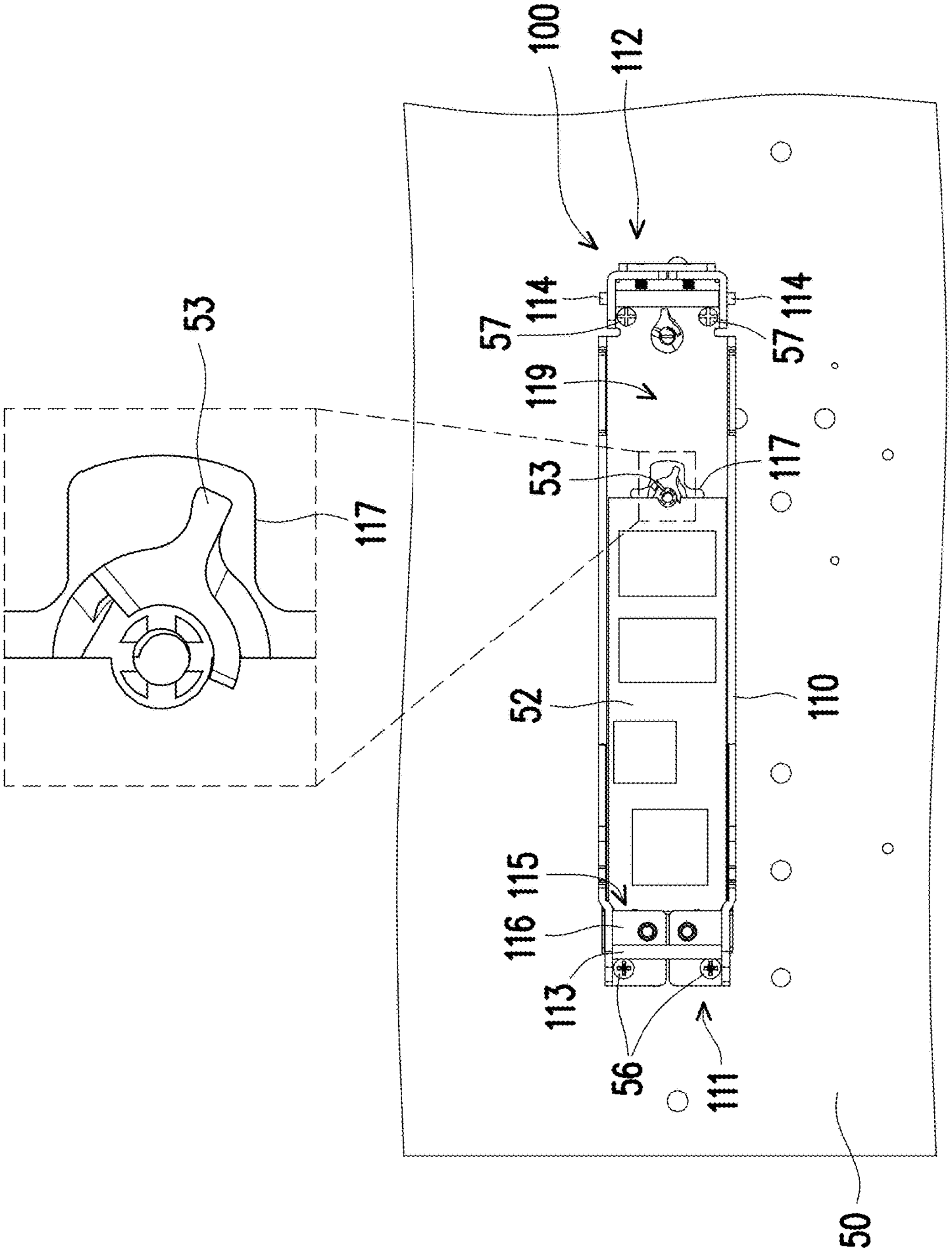

Referring to FIG. 7, FIG. 8, and FIG. 9, after the interface card 52 is installed in the connector 51, the fixing member 53 is rotated so that the interface card 52 is located between the fixing member 53 and the base assembly 110, and the interface card 52 is positioned between the fixing member 53 and the connector 51 to fix the position of the interface card 52 relative to the base assembly 110.

Figure 10:
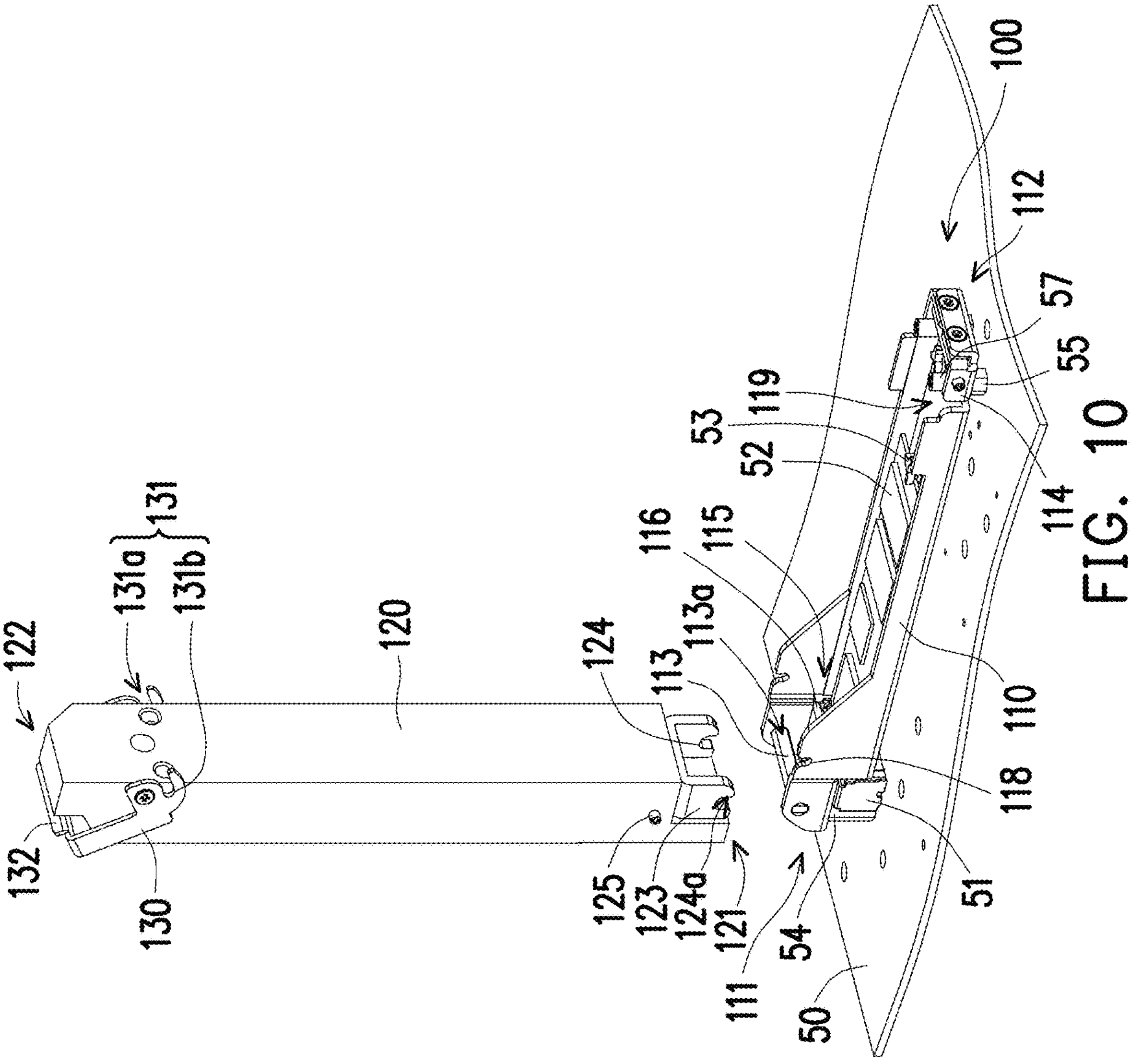
Figure 11:
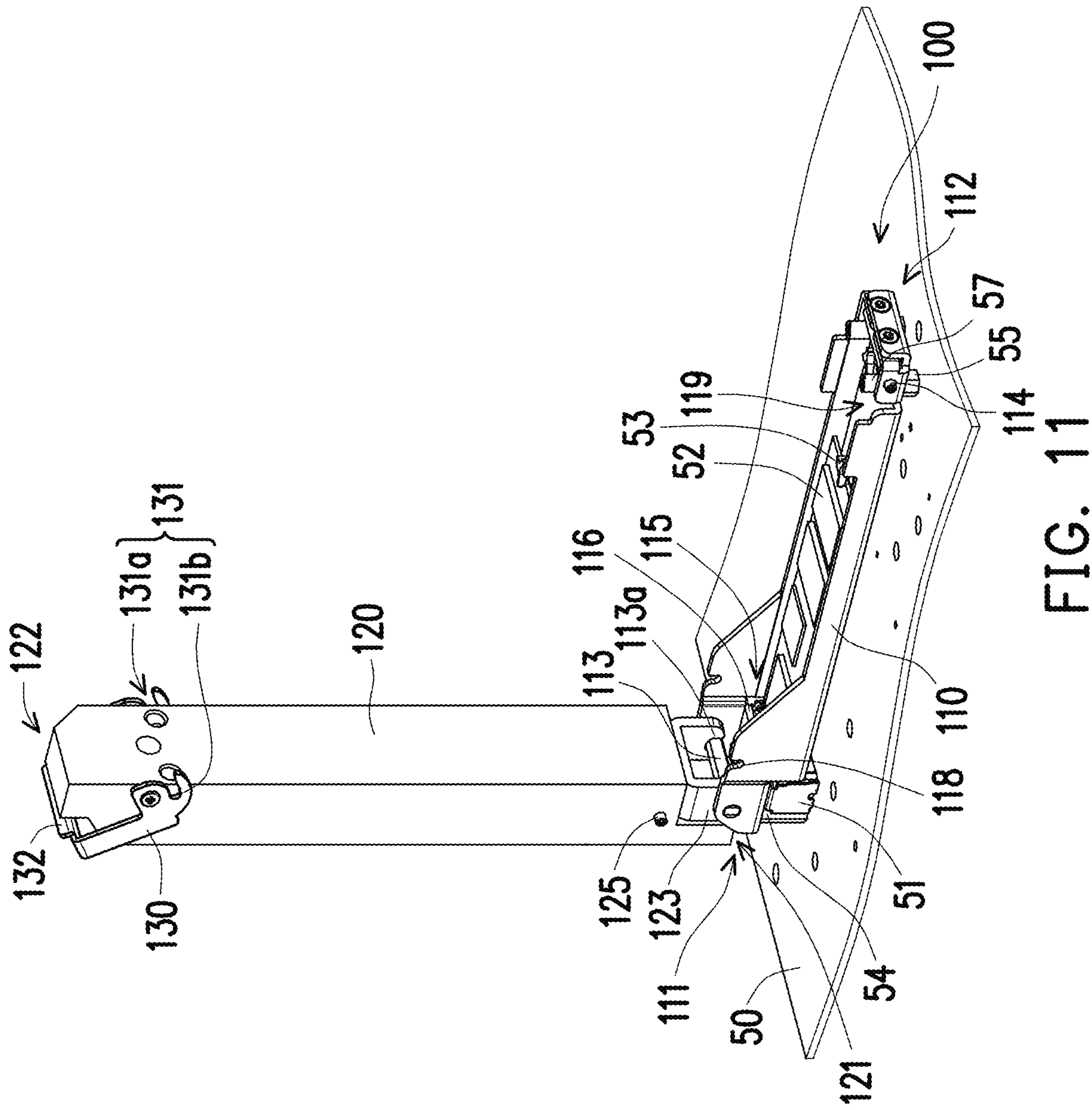

Referring to FIG. 10 and FIG. 11, after the interface card 52 is positioned by the fixing member 53, it is ensured in advance that the fastening member 130 will not interfere with the fastening portion 114 during the installation process. Then, the first opening 124 of the heat dissipation member 130 at the third end 121 is aligned with the fixing portion 113 of the base assembly 110 at the first end 111, and the first opening 124 is inserted on the fixing portion 113 at an angle such that the two second planes 124*a* of the first opening 124 and the two first planes 113*a* of the fixing portion 113 are parallel to each other.

Figure 12:
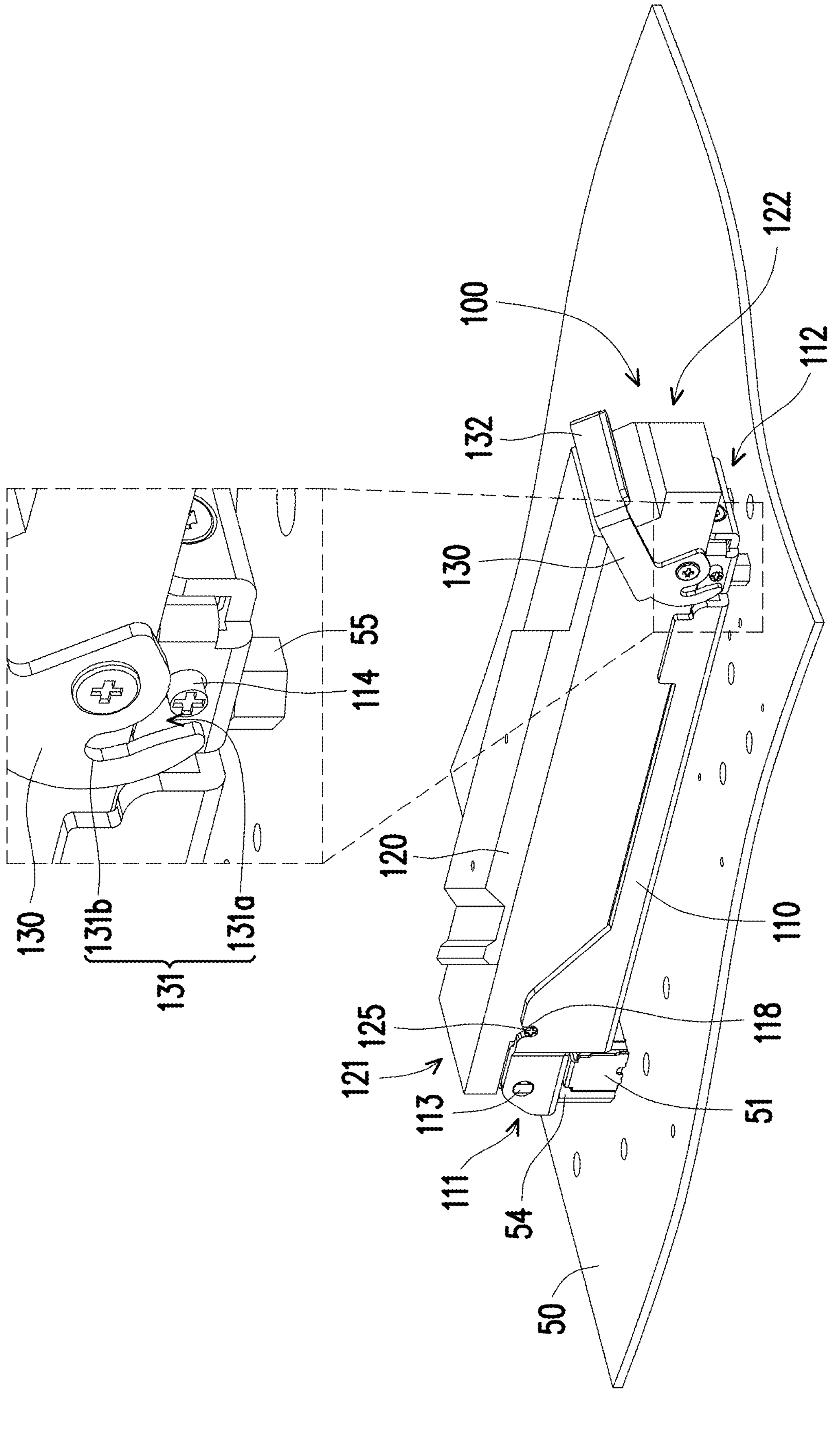
Figure 13:
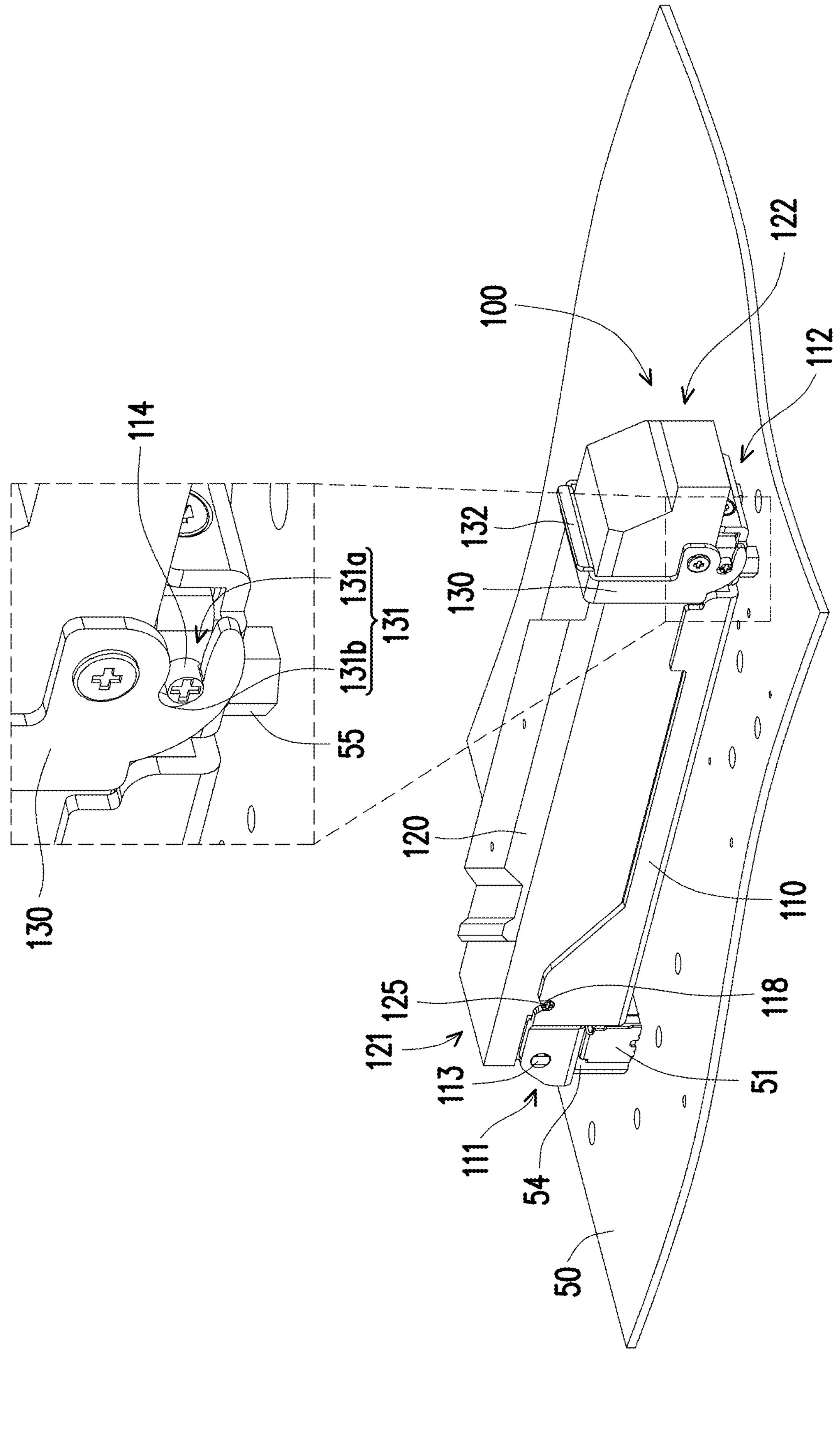
Figure 14:
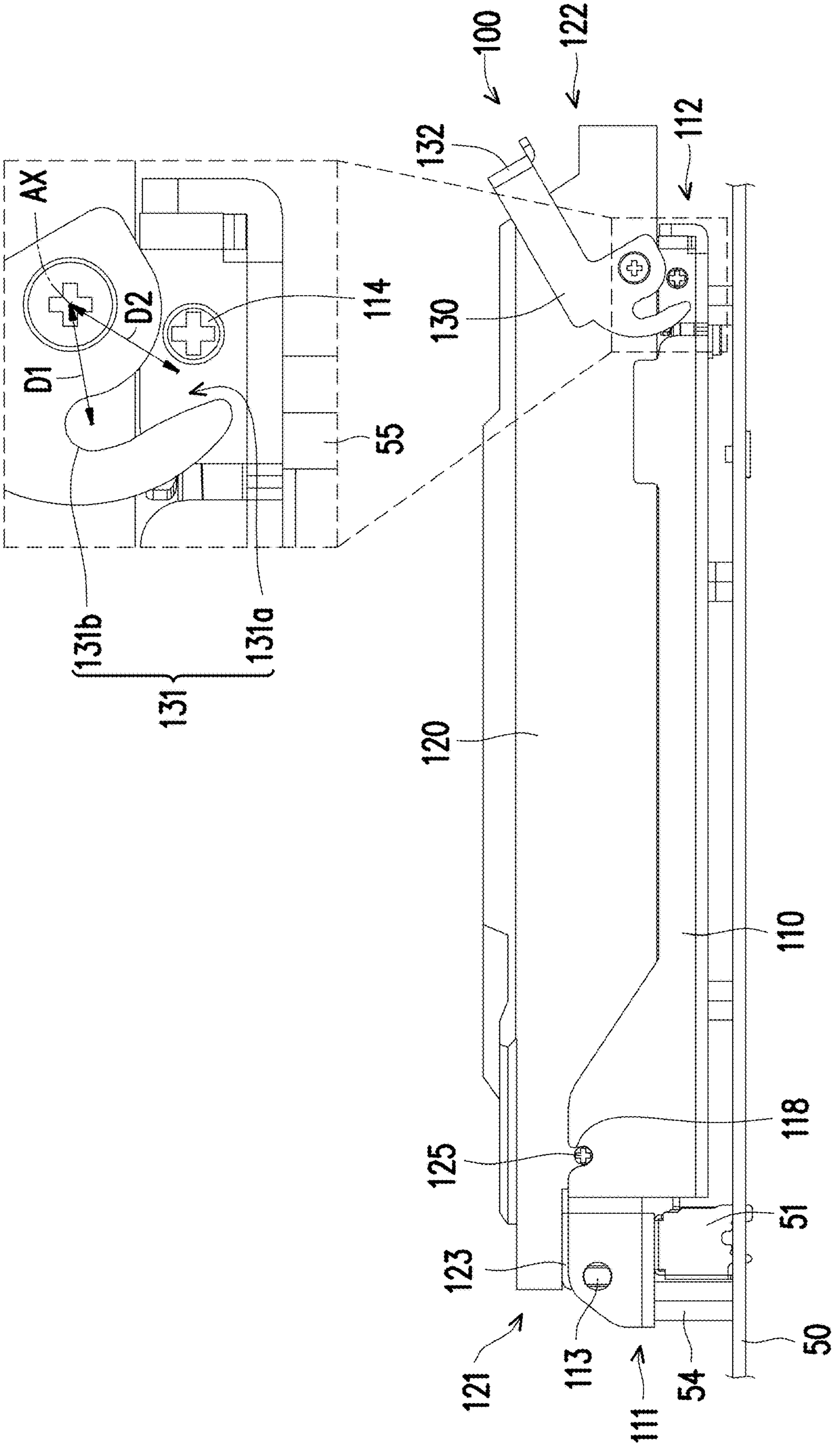
FIG. 14 is a schematic front view of the heat dissipation module and the motherboard of FIG. 12.
Figure 15:
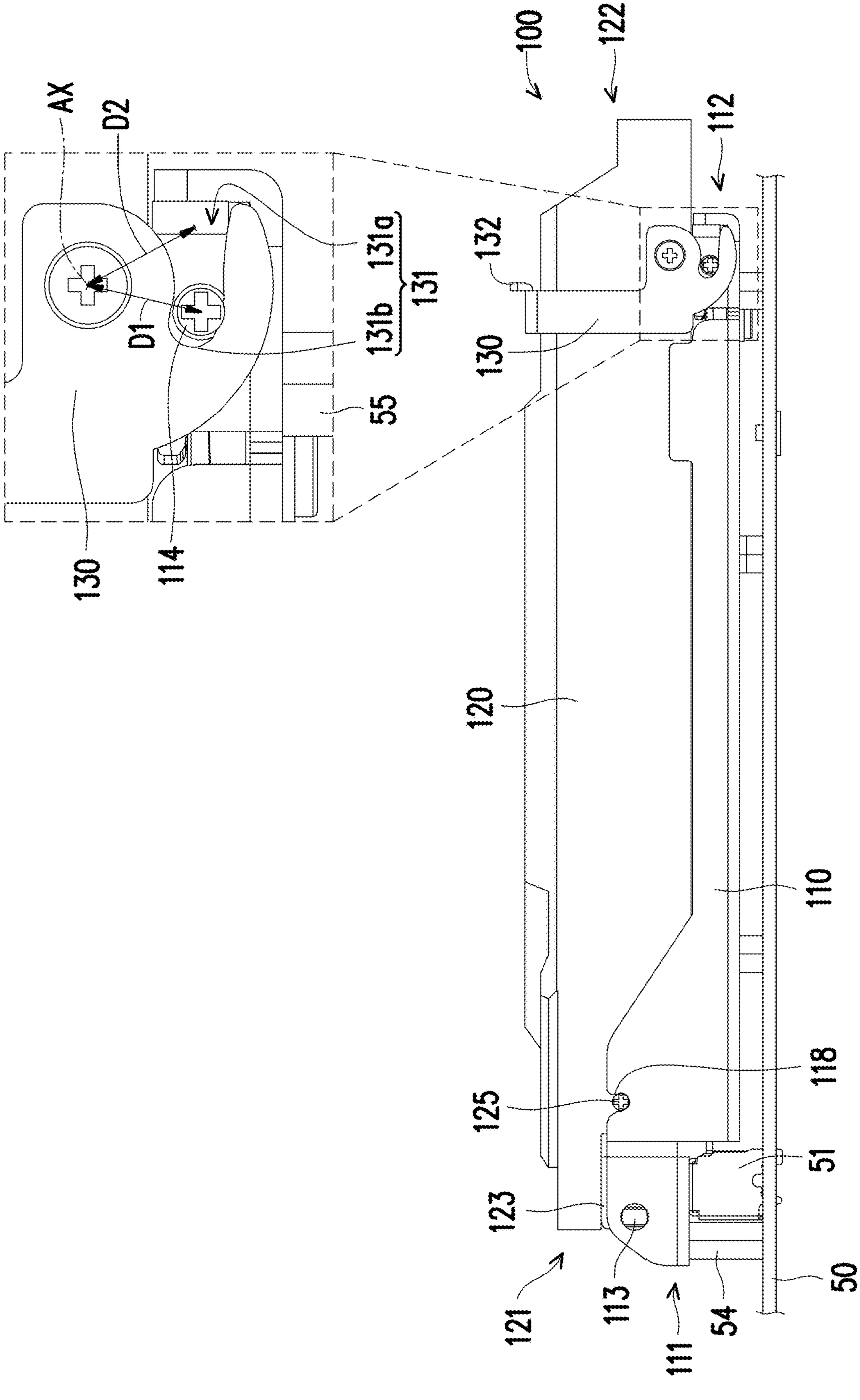
FIG. 15 is a schematic front view of the heat dissipation module and the motherboard of FIG. 13.
Figure 16:
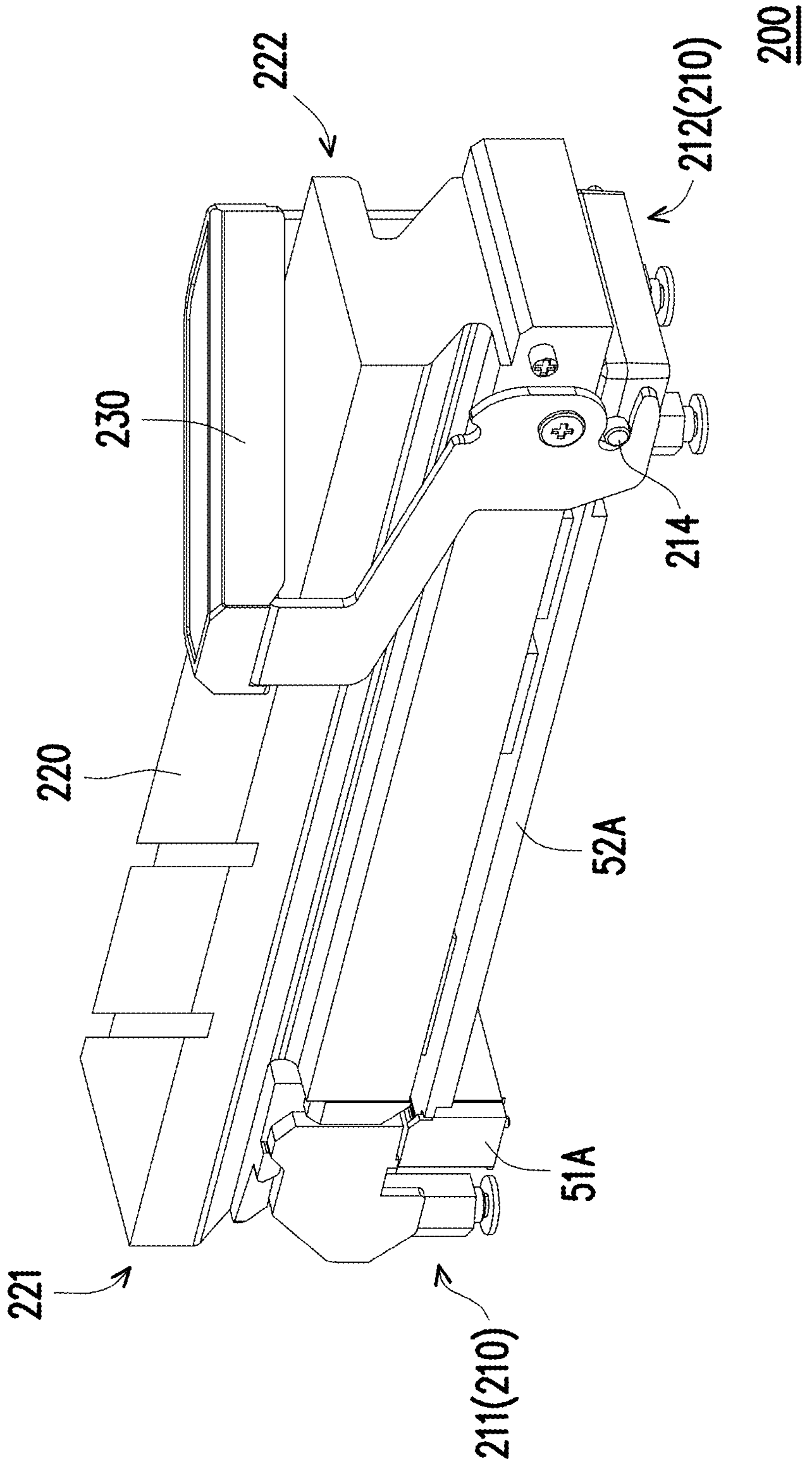
FIG. 16 and FIG. 17 are schematic views of a heat dissipation module according to a second embodiment of the disclosure from different viewing angles.
Figure 17:
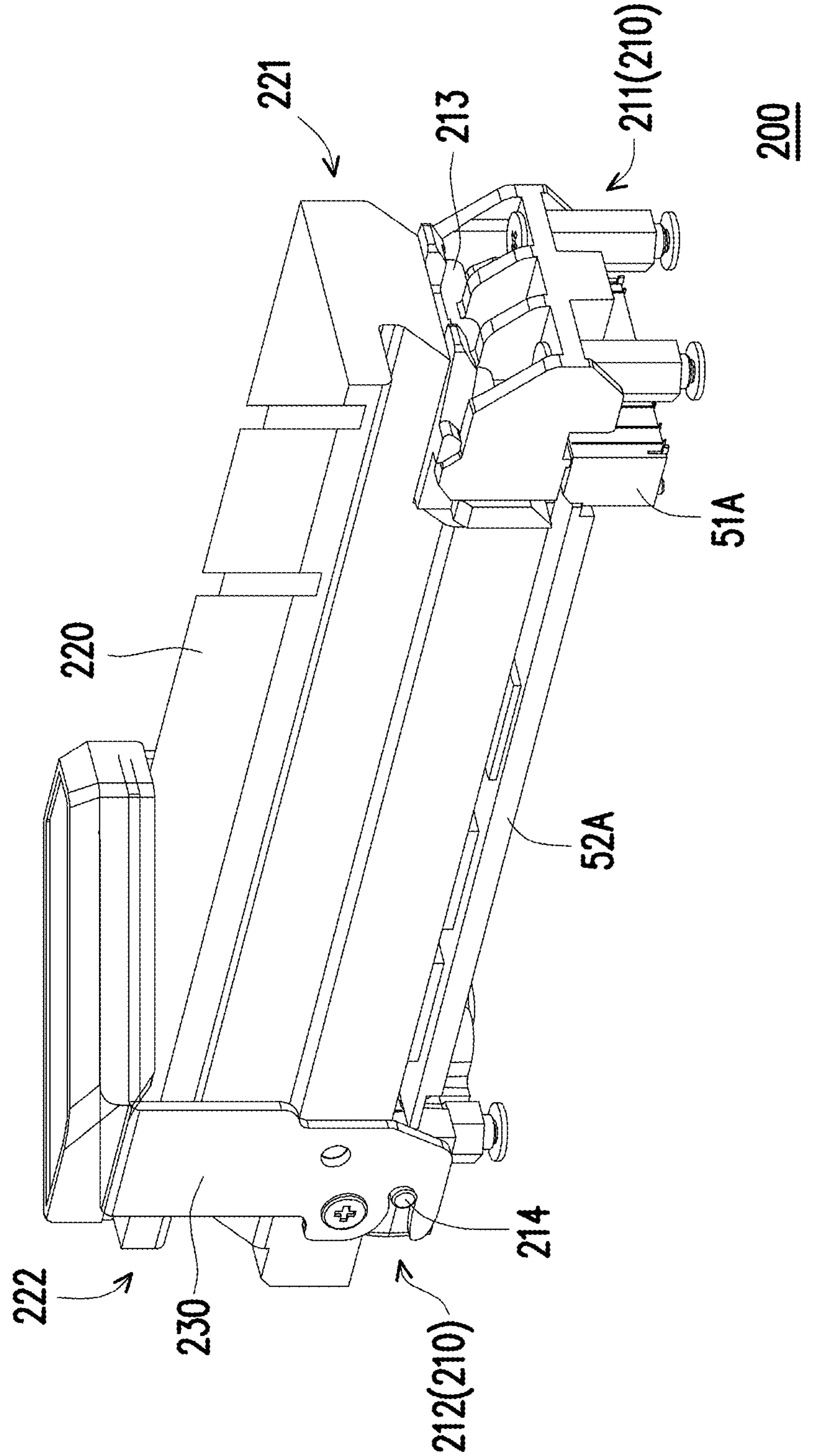
Figure 18:
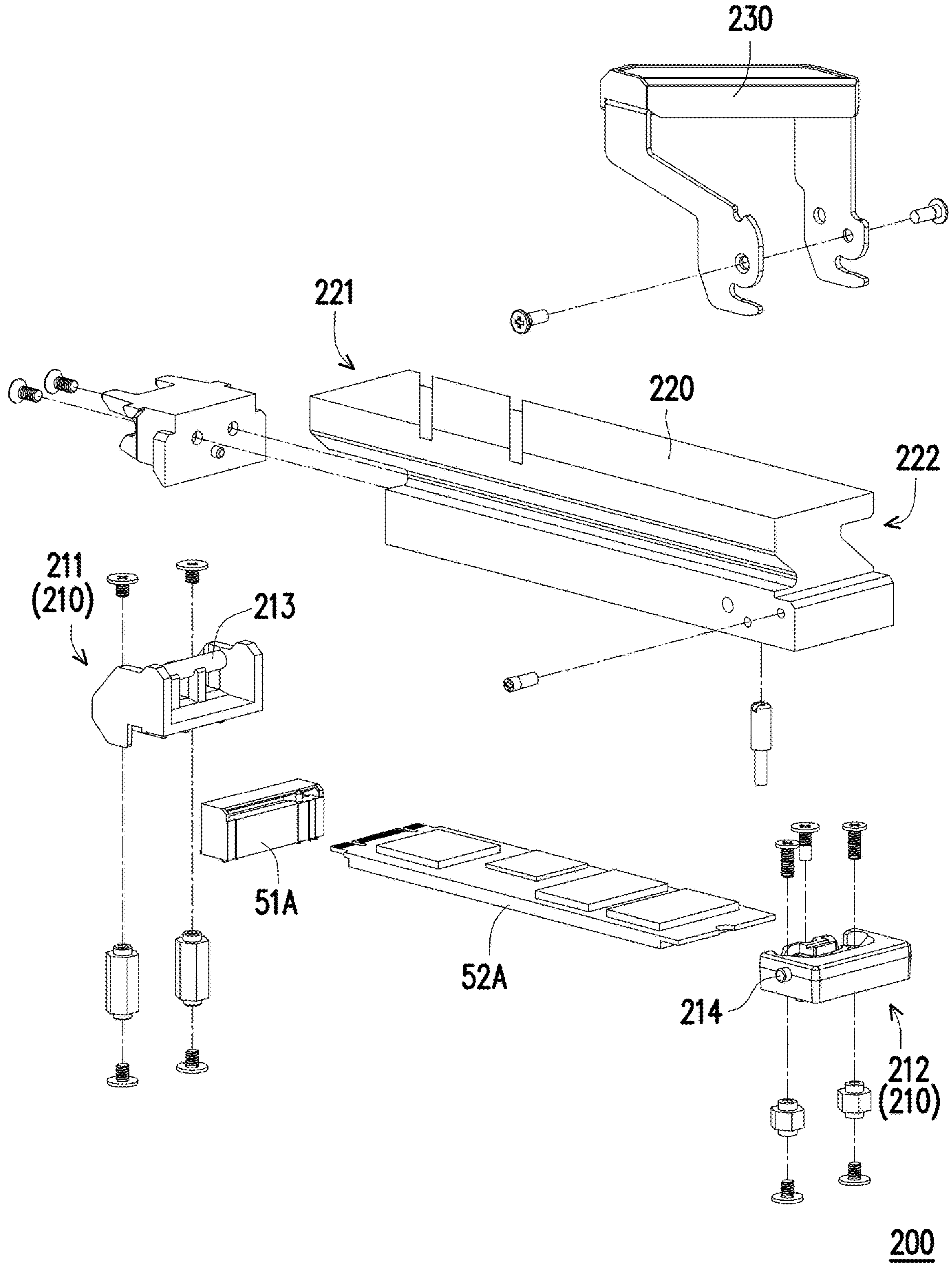
FIG. 18 and FIG. 19 are schematic exploded views of the heat dissipation module of FIG. 16 from different viewing angles.
Figure 19:
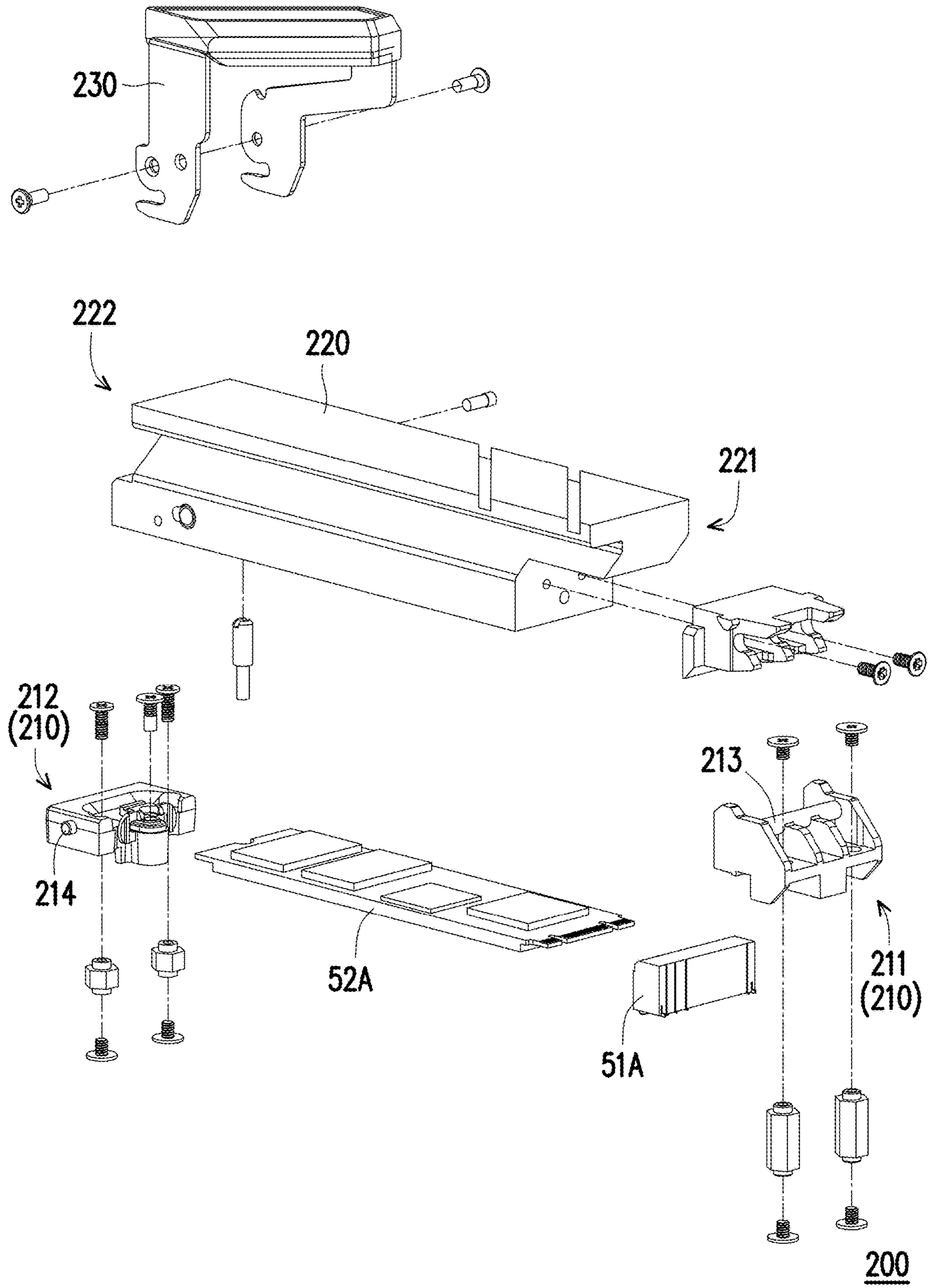
Figure 20:
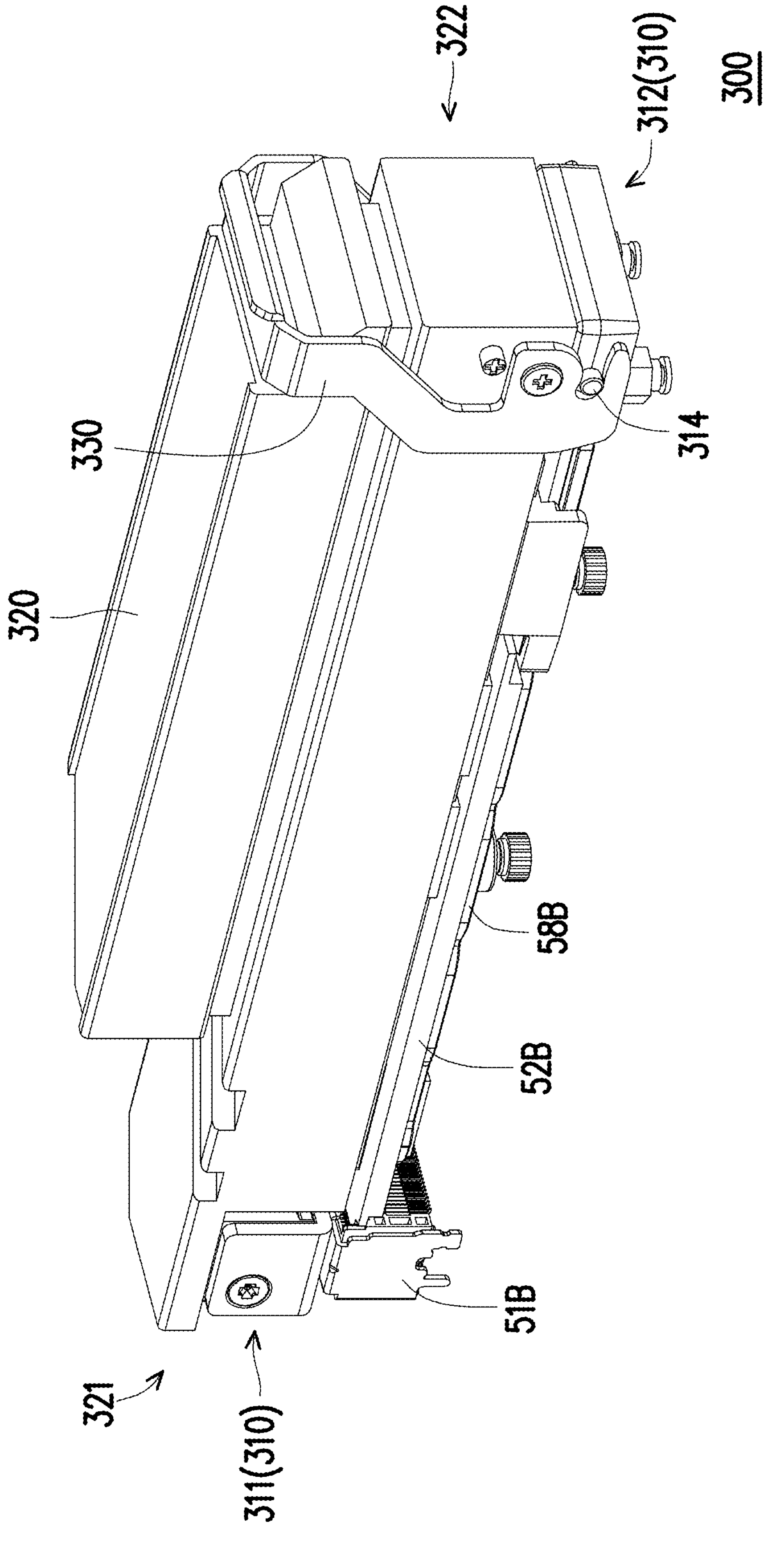
FIG. 20 and FIG. 21 are schematic views of a heat dissipation module according to a third embodiment of the disclosure from different viewing angles.
Figure 21:
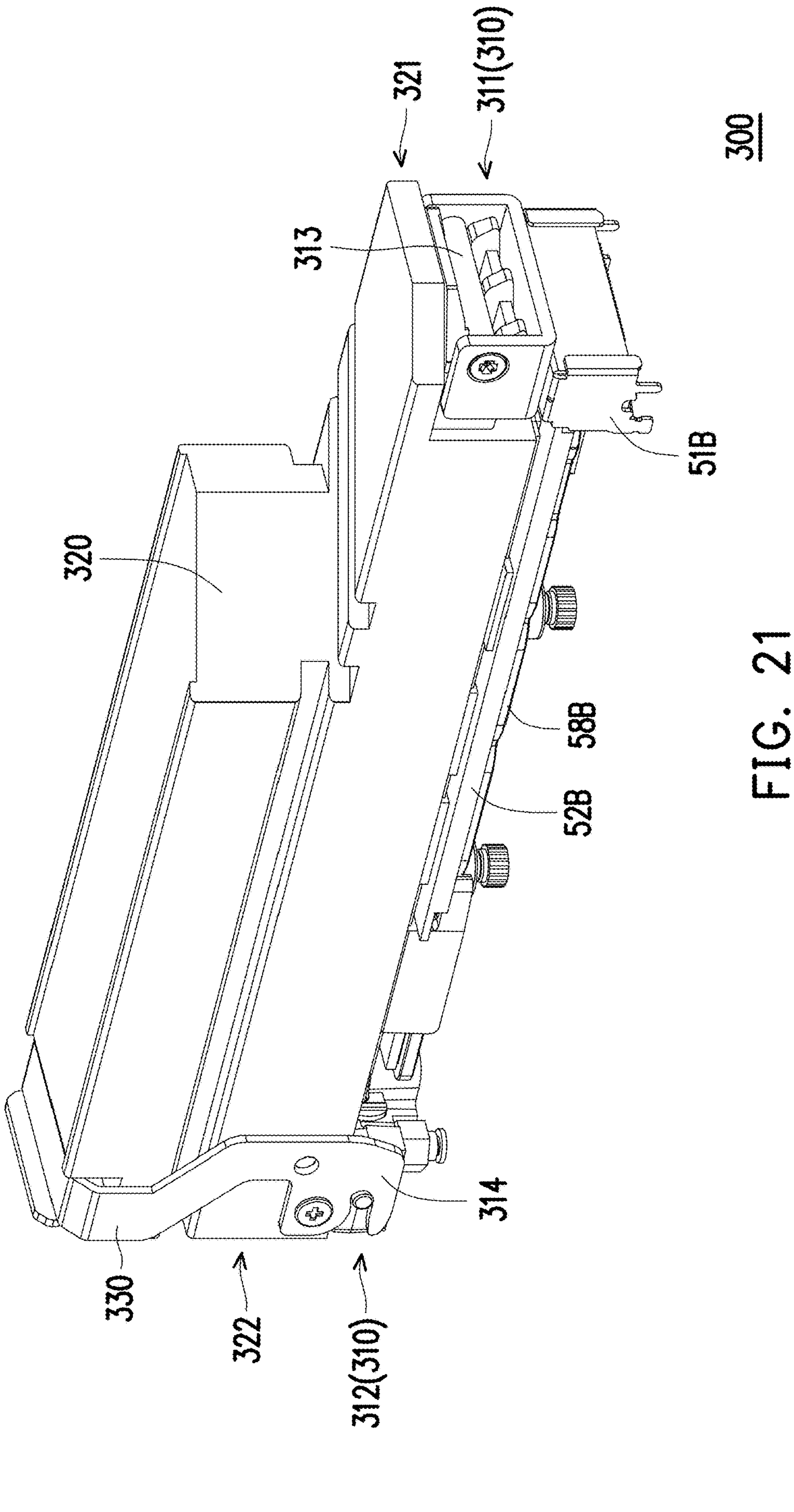
Figure 22:
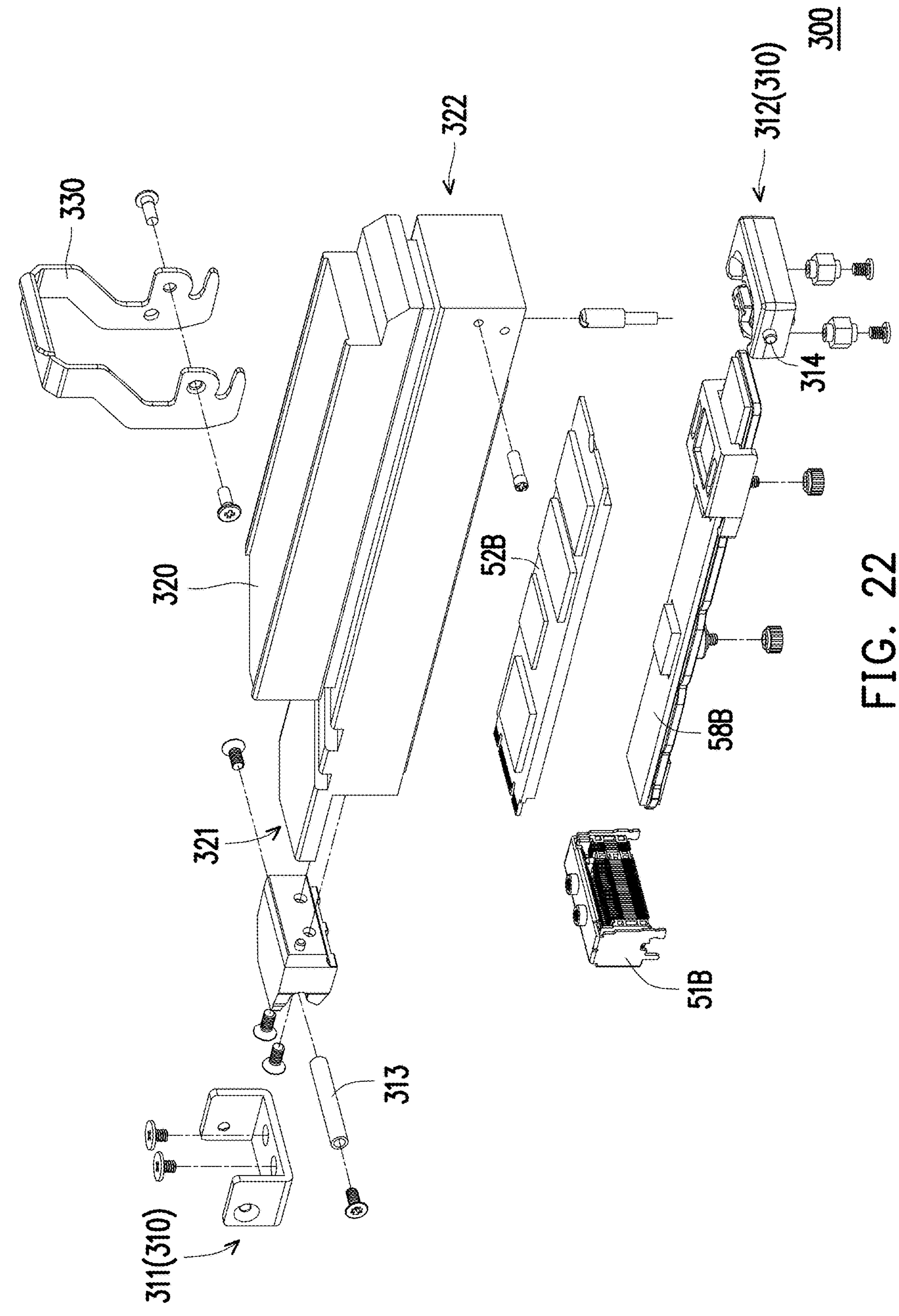
FIG. 22 and FIG. 23 are schematic exploded views of the heat dissipation module of FIG. 20 from different viewing angles.
Figure 23:
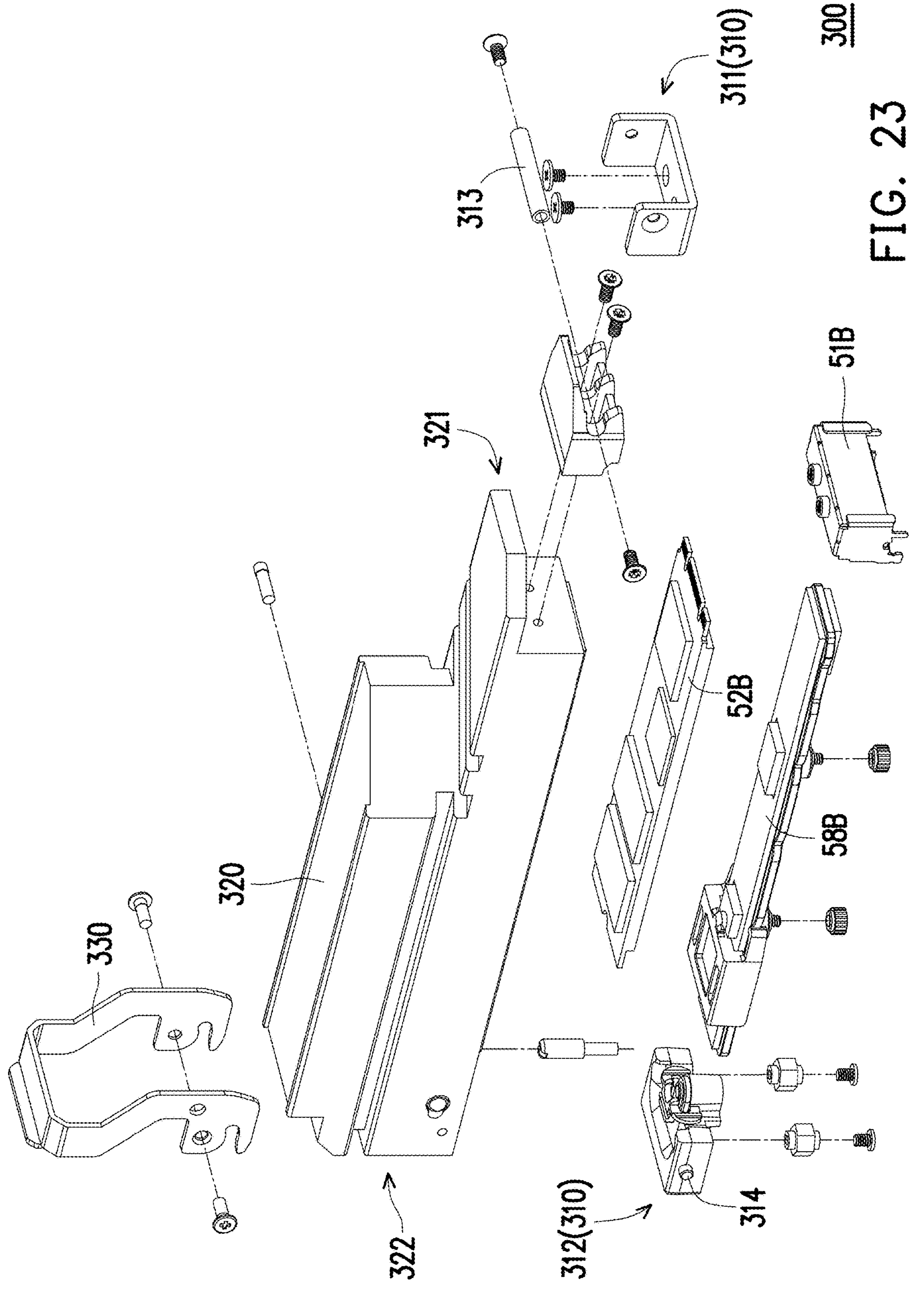

Referring to FIGS. 11 and 12, after the first opening 124 is inserted on the right position and thus being fixed, the heat dissipation member 120 is rotated with the fixing portion 113 as the axis, so that the fourth end 122 is rotated toward the first end 111 of the base assembly 110, and the two positioning portions 125 are moved into the two positioning grooves 118.

Referring to FIG. 12, FIG. 13, FIG. 14, and FIG. 15, after the fourth end 122 is rotated to the right position and thus being fixed, force is applied to the operating portion 132 to rotate the fastening member 130, so that the fastening portion 114 passes through the second opening 131*a* and finally abuts against the terminal end 131*b*, thus completing the process of installing the heat dissipation module 100 to the motherboard 50.

Referring to FIG. 16, FIG. 17, FIG. 18, and FIG. 19, the difference between a heat dissipation module 200 of the embodiment and the heat dissipation module 100 of the first embodiment lies in that: in the heat dissipation module 200 of the embodiment, a base assembly 210 is a multi-piece base body. The heat dissipation module 200 is adapted to be installed on a motherboard like the first embodiment, and the motherboard has a connector. The connector is adapted to connect an interface card. For brevity of explanation, the detailed structure of the motherboard, the base assembly, the heat dissipation member, and the fastening member as well as their operation and assembly principles will not be repeated here. In order to clearly see the structure of the heat dissipation module 200 in the drawings, the heat dissipation module 200 is directly shown in FIG. 16, FIG. 17, FIG. 18, and FIG. 19 without the motherboard to which it is applied.

The heat dissipation module 200 includes a base assembly 210, a heat dissipation member 220, and a fastening member 230. The base assembly 210 is adapted to be fixed on the motherboard. The base assembly 210 includes a first base body 211 and a second base body 212. The first base body 211 is adjacent to a connector 51A, and the first base body 211 has a fixing portion 213. The second base body 212 is away from the connector 51A, and the second base body 212 has a fastening portion 214. An interface card 52A is adapted to be installed between the first base body 211 and the second base body 212. The heat dissipation member 220 has a first side 221 and a second side 222 opposite to each other.

The first side 221 is adapted to be detachably connected to the fixing portion 213. The fastening member 230 is pivoted on the second side 222 and adapted to be detachably connected to the fastening portion 214. When the first side 221 is connected to the fixing portion 213, and the interface card 52A is connected to the connector 51A, the fastening portion 230 is connected to the fastening portion 214, so that the heat dissipation member 220 is fixed to the base assembly 210. The heat dissipation module 200 of the disclosure uses a quick release structure, so that the interface card 52A and the heat dissipation member 220 can be quickly installed and disassembled by the user with both hands without using hand tools, which has excellent ease of use.

In an embodiment, the first side 221 of the heat dissipation member 220 is fixed behind the connector 51A, and the heat dissipation member 220 can have various shapes, such as a stepped shape, but the disclosure is not limited thereto.

Referring to FIG. 20, FIG. 21, FIG. 22, and FIG. 23, a heat dissipation module 300 of the embodiment is the same as the heat dissipation module 100 of the second embodiment. A base assembly 310 is also a multi-piece base body. The heat dissipation module 300 is also adapted to be installed on a motherboard like the first embodiment, and the motherboard has a connector. The connector is adapted to connect an interface card. For brevity of explanation, the detailed structure of the motherboard, the base assembly, the heat dissipation member, and the fastening member as well as their operation and assembly principles will not be repeated here. In order to clearly see the structure of the heat dissipation module 300 in the drawings, the heat dissipation module 300 is directly shown in FIG. 20, FIG. 21, FIG. 22, and FIG. 23 without the motherboard to which it is applied.

The heat dissipation module 300 includes a base assembly 310, a heat dissipation member 320, and a fastening member 330. The base assembly 310 is adapted to be fixed on the motherboard. The base assembly 310 includes a first base body 311 and a second base body 312. The first base body 311 is adjacent to a connector 51B, and the first base body 311 has a fixing portion 313. The second base body 312 is away from the connector 51B, and the second base body 312 has a fastening portion 314. An interface card 52B is adapted to be installed between the first base body 311 and the second base body 312.

The heat dissipation member 320 has a first side 321 and a second side 322 opposite to each other. The first side 321 is adapted to be detachably connected to the fixing portion 313. The fastening member 330 is pivoted on the second side 322 and adapted to be detachably connected to the fastening portion 314. When the first side 321 is connected to the fixing portion 313, and the interface card 52B is connected to the connector 51B, the fastening member 330 is connected to the fastening portion 314, so that the heat dissipation member 320 is fixed to the base assembly 310. The heat dissipation module 300 of the disclosure uses a quick release structure, so that the interface card 52B and the heat dissipation member 320 can be quickly installed and disassembled by the user with both hands without using hand tools, which has excellent ease of use.

In an embodiment, the first side 321 of the heat dissipation member 320 is fixed above the connector 51B, and the heat dissipation member 320 can have various shapes, such as a stepped shape, but the disclosure is not limited thereto.

In an embodiment, a base plate 58B can be disposed between the first base body 311 and the second base body 312 to support the interface card 52B, and the interface card 52B is located between the base plate 58B and the heat dissipation member 320.

To sum up, in the heat dissipation module of the disclosure, the interface card is adapted to be installed between the first end and the second end. The third end is adapted to be detachably connected to the fixing portion. The fastening member is pivoted on the fourth end and adapted to be detachably connected to the fastening portion. When the third end is connected to the fixing portion, and the interface card is connected to the connector, the fastening member is connected to the fastening portion, so that the heat dissipation member is fixed to the base assembly. Through the quick release structure, the interface card and heat dissipation member can be quickly installed and disassembled by the user with both hands without using hand tools, which has excellent ease of use.

What is claimed is:

1. A heat dissipation module, adapted to be installed on a motherboard, wherein the motherboard has a connector, and the connector is adapted to connect an interface card, the heat dissipation module comprising:

- a base assembly, adapted to be fixed on the motherboard, wherein the base assembly is an integrated base body, the integrated base body has a first end and a second end opposite to each other, the first end is adjacent to the connector and has a fixing portion, the second end has a fastening portion, and the interface card is adapted to be installed between the first end and the second end;

a heat dissipation member, having a third end and a fourth end opposite to each other, wherein the third end is adapted to be detachably connected to the fixing portion; and a fastening member, pivoted on the fourth end, and adapted to be detachably connected to the fastening portion;

wherein when the third end is connected to the fixing portion, and the interface card is connected to the connector, the fastening member is connected to the fastening portion, so that the heat dissipation member is fixed to the base assembly.

2. The heat dissipation module according to claim 1, wherein the first end has an installation port, the installation port is aligned with the connector, and the interface card is adapted to pass through the installation port and be connected to the connector.

3. The heat dissipation module according to claim 1, wherein the base assembly has a leaning portion, and the connector is located between the motherboard and the leaning portion.

4. The heat dissipation module according to claim 1, wherein the motherboard has a rotatable fixing member, the base assembly has a plurality of through grooves penetrating through two sides, the fixing member passes through one of the through grooves, the base assembly is located between the motherboard and the fixing member, and the interface card is located between the connector and the fixing member.

5. The heat dissipation module according to claim 1, wherein the fixing portion is an installation shaft, the third end has a connecting portion, the connecting portion has a first opening, and the first opening is inserted on the installation shaft.

6. The heat dissipation module according to claim 1, wherein the fastening portion is a fixture block, the fastening member has a groove, and the fastening member is adapted to rotate such that the fixture block moves into the groove.

7. The heat dissipation module according to claim 6, wherein the fastening member has a second opening and a terminal end, the second opening and the terminal end are connected to two opposite ends of the groove, a first distance between the terminal end and a rotation axis of the fastening member is less than a first distance between the second opening and the rotation axis.

8. The heat dissipation module according to claim 1, wherein the fastening member has an operating portion, and the heat dissipation member is located between the base assembly and the operating portion.

9. The heat dissipation module according to claim 1, wherein the base assembly has two positioning grooves, the heat dissipation member has two positioning portions, and the two positioning portions are installed in the two positioning grooves.

10. A heat dissipation module, adapted to be installed on a motherboard, wherein the motherboard has a connector, and the connector is adapted to connect an interface card, the heat dissipation module comprising:

a base assembly, adapted to be fixed on the motherboard, wherein the base assembly comprises a first base body and a second base body, the first base body is adjacent to the connector and has a fixing portion, the second base body is away from the connector and has a fastening portion, and the interface card is adapted to be installed between the first base body and the second base body;

a heat dissipation member, having a first side and a second side opposite to each other, wherein the first side is adapted to be detachably connected to the fixing portion; and a fastening member, pivoted on the second side, and adapted to be detachably connected to the fastening portion;

wherein when the first side is connected to the fixing portion, and the interface card is connected to the connector, the fastening member is connected to the fastening portion, so that the heat dissipation member is fixed to the base assembly.

11. The heat dissipation module according to claim 10, further comprising a base plate disposed between the first base body and the second base body, wherein the interface card is located between the base plate and the heat dissipation member.

* * * * *